US006825662B2

(12) United States Patent
Nistler et al.

(10) Patent No.: US 6,825,662 B2
(45) Date of Patent: Nov. 30, 2004

(54) METHOD AND APPARATUS FOR CONTINUOUSLY, DIRECTLY MONITORING THE RF-TIGHTNESS OF A SHIELDED CUBICLE OF AN MR SYSTEM

(75) Inventors: Juergen Nistler, Erlangen (DE); Wolfgang Renz, Erlangen (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/348,296

(22) Filed: Jan. 21, 2003

(65) Prior Publication Data

US 2003/0155920 A1 Aug. 21, 2003

(30) Foreign Application Priority Data

Feb. 19, 2002 (DE) .......................................... 102 06 901

(51) Int. Cl.[7] .................................................. G01V 3/00
(52) U.S. Cl. ...................................................... 324/318
(58) Field of Search ................................ 324/307, 309, 324/318, 300, 322; 333/219; 600/410, 422

(56) References Cited

FOREIGN PATENT DOCUMENTS

DE      PS 197 03 916      5/2001

OTHER PUBLICATIONS

IEEE Standard Method for Measuring the Effectiveness of Electromagnetic Shielding Enclosures (IEEE Std 299–1997), Dec. 9, 1997.

"Case Study—MRI Facility in Hospital Environment," Sathyanarayanan et al., IEEE Int. Conf. on Electromagnetic Interference and Compatibility (1995) pp. 273–279.

"Kernspintomographen bracuhen Abschirmung," Schaller et al., Siemens Components, vol. 22, No. 4 (1984) pp. 160–165.

*Primary Examiner*—Brij Shrivastav
*Assistant Examiner*—Dixomara Vargas
(74) *Attorney, Agent, or Firm*—Schiff Hardin LLP

(57) ABSTRACT

In a method and apparatus for continuously, directly monitoring the RF-tightness of a shielded cubicle of an MR system, a radio-frequency signal is transmitted to the cubicle from the outside via an antenna and the signal part that passes to the interior is identified with a receiver in the inside of the cubicle. An RF transmission antenna arranged at the outside in the door region of the shielded cubicle is connected to an RF output of the MR system, and a body coil of the MR system is employed as a reception antenna for determining the RF tightness of the shielded cubicle of the MR system, and is connected to a monitoring receiver.

8 Claims, 1 Drawing Sheet

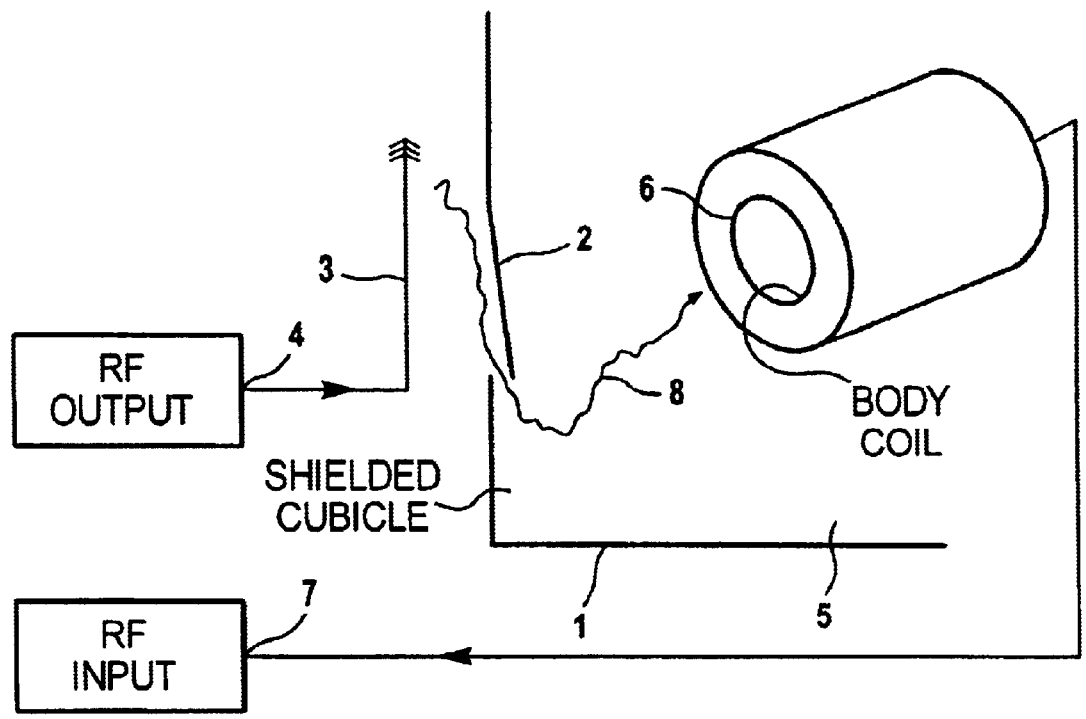
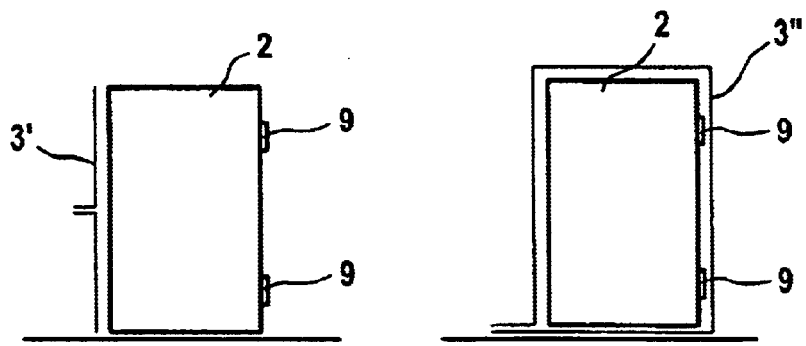
FIG 1
FIG 2    FIG 3

METHOD AND APPARATUS FOR CONTINUOUSLY, DIRECTLY MONITORING THE RF-TIGHTNESS OF A SHIELDED CUBICLE OF AN MR SYSTEM

BACKGROUND OF THE INVENTION

1. Field of the Invention

The present invention is directed to a method and apparatus for continuously, directly monitoring the RF-tightness of a shielded cubicle in an MR system of the type wherein a radio-frequency signal is transmitted onto the cubicle from the outside via an antenna and the signal part that passes through to the cubicle interior is identified with a receiver in the inside of the cubicle 2. Description of the Prior Art RF shielded cubicles and their faultless functioning are responsible in part for the image quality that can be achieved with MR systems. A leaky RF cubicle can lead to image disturbances as a result of discrete noise sources and to a reduction of the signal-to-noise ratio that is achieved. A critical and highly stressed element is the RF seal of the access doors. Despite a properly closed door, this can slowly or even suddenly deteriorate due to dirty or bent seal springs without being directly detected.

Conventionally, this problem has been addressed by means of regular shield attenuation measurements were implemented in regular system maintenance (by a service technician). Monitoring contacts that detect whether the door is mechanically closed are a further known measure. This monitoring of the closed door, however, is of no use whatsoever when the RF-tightness deteriorates due to contamination or the aforementioned bending of the seal springs. Regular maintenance, of course, ensues only at intervals of weeks or even months, so that an image disruption due to leaks of the radio-frequency seal and of the access door of a shielded cubicle can be present over a longer time span and significantly degrade the MR exposures during this time span.

For monitoring the RF tightness of all types of cubicles, IEEE Std 299-1997, 21 Apr. 1998 describes a mechanism wherein a radio-frequency signal is transmitted onto the cubicle from the outside via an antenna and the signal part that passes to the interior is identified with a receiver in the inside of the cubicle. The measurement arrangement that is disclosed in the periodical Siemens Components 22 (1994) number 4, pp 160–165, for measuring the shield attenuation in the certification of shielded MR systems is also constructed in the same way. The equipment required therefor is respectively made available during a maintenance or check. Leaving the high costs of the monitoring device entirely out of consideration, a continuous measurement of the RF tightness is not provided in either instance, nor can it be meaningfully achieved.

SUMMARY OF THE INVENTION

An object of the present invention is to provide a device of the type initially described, but which allows continuous and direct monitoring of the RF tightness of shielded cubicle of an MR system independently of maintenance intervals and the presence of a service technician.

This object is inventively achieved by providing an RF transmission antenna at the outside in the door region of the shielded cubicle connected to an RF output of the MR system, and a body coil of the MR system is employed as a reception antenna for determining the RF tightness of the shielded cubicle of the MR system and is connected to a monitoring receiver. The RF signal preferably is modulated in a specific manner in order to be able to filter it out of the noise better, even in the case of relatively minute leaks, and thus to allow detection of incipient RF leaks very early. The capability of modulating the RF signal is already present in conventional MR systems.

This direct utilization of the MR system and its components for the monitoring of the RF tightness of a shielded cubicle makes this monitoring very simple and inexpensive since nearly no separate assemblies at all are required for the monitoring device; rather, system parts that already exist in an MR system can be put to use for this monitoring of the RF tightness.

A signal to be radiated for this purpose is generated by the frequency processing in the MR electronics, with the signal being amplified if necessary and forwarded to an antenna structure in the proximity of the cubicle door. This antenna structure can be either a dipole antenna arranged next to the side of the door that opens or, preferably, can be a loop antenna integrated into the doorframe. The frequency of the signal preferably is at the operating frequency of the MR system so that the RF tightness is monitored in exactly that range wherein, of course, noise source, if present, could also cause the greatest harm in an MR examination.

At the same time, reception is carried out with the body coil or a local coil in the cubicle, and the signal level at the transmission frequency of the outside antenna also is acquired. A suitable point in time for the implementation of this monitoring of the RF tightness, for example, is during the adjustment for preparing for a measurement, during which time it can be assumed that the cubicle door has been properly closed. If a level of the detected signal that lies above a defined threshold is received in this measurement, the system generates a corresponding message that, for example, can result in the generation of an alarm for the operator ("need to check tightness of the RF cubicle, image quality can be negatively influenced" or the like).

An advantage of the inventive method is a true acquisition of the relevant quantities (tightness of the shielded cubicle) immediately at the relevant point in time for an examination, and an advantage of the apparatus for the implementation of this method is that, except for the RF transmission antenna, practically no additional components at all are required.

DESCRIPTION OF THE DRAWINGS

FIG. 1 is a schematic block diagram of an inventive RF monitoring apparatus with the signal paths.

FIG. 2 is a view of a shielded cubicle with a door and a dipole antenna arranged at the side thereof that opens.

FIG. 3 is a view corresponding to FIG. 2 with a magnetic frame antenna that can be integrated into the doorframe.

DESCRIPTION OF THE PREFERRED EMBODIMENTS

In FIG. 1, a part of the outside wall of a shielded cubicle for an MR system is referenced 1, this wall part 1 having an access door representing the principal cause of RF leaks in practice. The other parts—walls, ceiling, floor, etc.—of the shielded cubicle represent minimal sources of RF leaks in practice, these, of course, having been checked for RF tightness during assembly. In order to detect for the presence of RF leaks, for example due to a contamination or bending of the seal springs of the access door 2 that can re-occur after every opening and closing, an antenna 3 is arranged outside the cubicle. This antenna 3 being connected to a radio-frequency output 4 of the MR electronics in the exemplary embodiment shown in FIG. 1. The radio-frequency signal at the output 4, which preferably is at the operating frequency of the MR system, is emitted via the antenna 3 and can proceed into the interior 5 of the shielded cubicle if an RF leak is present, which would mainly occur at the opening side of the access door 2. Therein, such a noise signal (if present) is received by a coil, preferably a body coil 6, of the MR system that is or can be used in the course of a conventional MR data acquisition for imaging. The detected signal is applied to an RF input of the MR electronics in order to be measured via the electronics of the MR system itself, i.e. without requiring any additional components. By modulating the RF signal at the RF output 4, such as with a following modulation amplifier, a noise signal 8, if present, can be filtered out of the ambient noise especially well in the interior 5 of the shielded cubicle 1.

FIG. 2 schematically shows how the antenna 3 can be fashioned for the noise measurement. In the exemplary embodiment shown in FIG. 2, the RF transmission antenna 3 is a dipole antenna 3—that is arranged at the side of the door lying opposite the door jamb 9 and parallel thereto, for example at or next to the door frame.

A magnetic loop antenna 3" that is preferably integrated in the doorframe is provided in the exemplary embodiment of FIG. 3 instead of the dipole antenna shown in FIG. 2. This loop antenna 3" monitors the entire door gap around the door and thus offers an especially high dependability of the monitoring.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance apparatus comprising:

a shielded cubicle;

a magnetic resonance apparatus having a plurality of apparatus components, including a body coil, disposed inside of said shielded cubicle, and said magnetic resonance apparatus also having a source of radio-frequency energy;

an antenna disposed outside of said shielded cubicle and connected to said source of radio-frequency energy of said magnetic resonance apparatus for transmitting a radio-frequency signal into said shielded cubicle from an exterior thereof;

an evaluation unit connected to said body coil, said body coil receiving a portion of said radio-frequency signal transmitted by said antenna in said evaluation unit evaluating radio-frequency tightness of said shielded cubicle dependent on said portion of said signal transmitted by said antenna received by said body coil.

2. An apparatus as claimed in claim 1 wherein said evaluation unit comprises a monitoring receiver which is one of said components of said magnetic resonance system.

3. An apparatus as claimed in claim 1 wherein said cubicle has an access door, and wherein said antenna comprises a dipole antenna disposed at a side of said access door.

4. An apparatus as claimed in claim 1 wherein said shielded cubicle has an access door with a doorframe, and wherein said antenna comprises a magnetic loop antenna integrated into said door frame.

5. A method for continuously, directly monitoring RF tightness of a shielded cubicle of a magnetic resonance system, comprising the steps of:

disposing a plurality of components, including a body coil, of a magnetic resonance operating in an interior of a shielded cubicle for use in conducting a magnetic resonance examination;

generating a radio-frequency signal with a radio-frequency source of said magnetic resonance apparatus and transmitting said radio-frequency signal from an antenna disposed at an exterior of said shielded cubicle;

receiving a signal portion of said signal transmitted by said antenna, which passes into an interior of said shielded cubicle, with said body coil; and evaluating RF tightness of said shielded cubicle dependent on the signal portion received by said body coil.

6. A method as claimed in claim 5 wherein said components of said magnetic resonance system include a monitoring receiver used for conducting said magnetic resonance examination, and wherein the step of evaluating said signal portion received by said body coil comprises evaluating said signal portion in said monitoring receiver.

7. A method as claimed in claim 5 wherein said shielded cubicle has an access door, and comprising the step of employing a dipole antenna as said antenna and arranging said dipole antenna next to said access door.

8. A method as claimed in claim 5 wherein said shielded cubicle has an access door with a doorframe, and comprising employing a magnetic loop antenna as said antenna, and integrating said magnetic frame antenna into said door frame.

* * * * *